United States Patent
Bell et al.

(10) Patent No.: US 9,312,469 B2
(45) Date of Patent: Apr. 12, 2016

(54) CERAMIC

(75) Inventors: Andrew John Bell, Leeds (GB);
Timothy Comyn, Leeds (GB)

(73) Assignee: University of Leeds, Leeds, Yorkshire (GB)

(*) Notice: Subject to any disclaimer, the term of this patent is extended or adjusted under 35 U.S.C. 154(b) by 323 days.

(21) Appl. No.: 13/812,039

(22) PCT Filed: Jul. 19, 2011

(86) PCT No.: PCT/GB2011/051356
§ 371 (c)(1),
(2), (4) Date: Mar. 7, 2013

(87) PCT Pub. No.: WO2012/013956
PCT Pub. Date: Feb. 2, 2012

(65) Prior Publication Data
US 2013/0207020 A1 Aug. 15, 2013

(30) Foreign Application Priority Data

Jul. 28, 2010 (GB) .................................. 1012637.3
Jan. 17, 2011 (GB) .................................. 1100696.2

(51) Int. Cl.
| | |
|---|---|
| H01L 41/187 | (2006.01) |
| C04B 35/475 | (2006.01) |
| C04B 35/26 | (2006.01) |
| C04B 35/462 | (2006.01) |
| H01L 41/43 | (2013.01) |

(52) U.S. Cl.
CPC ............ *H01L 41/1878* (2013.01); *C04B 35/26* (2013.01); *C04B 35/462* (2013.01); *C04B 35/475* (2013.01); *H01L 41/43* (2013.01); *C04B 2235/3201* (2013.01); *C04B 2235/3232* (2013.01); *C04B 2235/3272* (2013.01); *C04B 2235/3275* (2013.01); *C04B 2235/3296* (2013.01); *C04B 2235/3298* (2013.01); *C04B 2235/656* (2013.01); *C04B 2235/6562* (2013.01); *C04B 2235/6565* (2013.01); *C04B 2235/6567* (2013.01); *C04B 2235/76* (2013.01); *C04B 2235/765* (2013.01); *C04B 2235/766* (2013.01); *C04B 2235/768* (2013.01); *C04B 2235/77* (2013.01); *C04B 2235/81* (2013.01)

(58) Field of Classification Search
CPC .... C04B 35/26; C04B 35/462; C04B 35/475; C04B 2235/768; H01L 41/18; H01L 41/187; H01L 41/1871; H01L 41/1873; H01L 41/1876; H01L 41/1878; H01L 41/13
USPC .............. 252/62.9 R, 62.9 PZ; 501/134–139; 310/358
See application file for complete search history.

(56) References Cited

U.S. PATENT DOCUMENTS

| | | | |
|---|---|---|---|
| 2002/0036282 A1* | 3/2002 | Chiang et al. | C01G 23/006 252/62.9 PZ |
| 2009/0236947 A1* | 9/2009 | Comyn et al. | 310/363 |
| 2011/0006243 A1* | 1/2011 | Sasaki | C23C 14/0036 252/62.9 PZ |

FOREIGN PATENT DOCUMENTS

| | | | |
|---|---|---|---|
| JP | 2000128632 A | | 5/2000 |
| JP | 2000128632 A | * | 5/2000 |
| JP | 2008 069051 A | | 3/2008 |
| JP | 2008069051 A | * | 3/2008 |
| JP | 2010 126421 A | | 6/2010 |
| JP | 2010126421 A | * | 6/2010 |
| JP | 2011042555 A | | 3/2011 |
| JP | 2011063501 A | | 3/2011 |
| JP | 2011238708 A | | 11/2011 |
| WO | WO-2006/032872 A1 | | 3/2006 |
| WO | WO-2010/114148 A1 | | 10/2010 |

OTHER PUBLICATIONS

Machine translation of JP 2010126421 A, printed Nov. 17, 2014.*
Machine translation of JP 2008069051 A, printed Nov. 17, 2014.*
Machine translation of JP2000128632A, printed Oct. 7, 2015.*
Aksel, Elena et al.: "Advances in Lead-Free Piezoelectric Materials for Sensors and Actuators," Sensors, vol. 10, No. 3, Mar. 10, 2010, pp. 1935-1954, XP55006962, ISSN: 1424-8220, DOI: 10.3390/s100301935, Chapter 7, Summary, p. 1948; p. 1941; table A1.
Takenaka, Tadashi et al.: "Phase Transition Temperatures and Piezoelectric Properties of $(Bi_{1/2}Na_{1/2})TiO_3$- and $(Bi_{1/2}K_{1/2})TiO_3$-Based Bismuth Perovkskite Lead-Free Ferroelectric Ceramics," IEEE Transactions on Ultrasonics, Ferroelectrics and Frequency Control, IEEE, US, vol. 56, No. 8, Aug. 1, 2009, pp. 1595-1612, XPO11271280, ISSN: 0885-3010, DOI: 10.1109/TUFFC.2009.1224, the whole document.
International Search Report and Written Opinion for PCT/GB2011/051356, mailed Sep. 29, 2011; ISA/EP.
Azough, Feridoon et al.: "Microstructure and properties of Co-, Ni-, Zn-, Nb- and W-modified multiferroic $BiFeO_3$ ceramics", Journal of the European Ceramic Society 30 (2010) 727-736.
Bennett, J. et al.: "Multiferroic properties of $BiFeO_3$-$(K_{0.5}Bi_{0.5})TiO_3$ ceramics", Materials Letters 94 (2013) 172-175.
Bennett, J. et al.: "Exceptionally large piezoelectric strains in $BiFeO_3$-$(K_{0.5}Bi_{0.5})TiO_3$—$PbTiO_3$ ceramics", Scripta Materialia xxx (2012) xxx-xxx, pp. 1-4.
Cheng, Z. X. et al.: "A way to enhance the magnetic moment of multiferroic bismuth ferrite", Institute of Physics Publishing, Journal of Physics D: Applied Physics 43 (2010) 242001 (5 pp).
Dorcet, V. et al.: "Properties of the solid solution $(1-x)Na_{0.5}Bi_{0.5}TiO_3$-$(x)BiFeO_3$", Journal of Magnetism and Magnetic Materials 321 (2009) 1762-1766.
Elkechai, O. et al.: "$Na_{0.5}Bi_{0.5}TiO_3$—$K_{0.5}Bi_{0.5} TiO_3$ (NBT-KBT) System: A Structural and Electrical Study", phys. stat. sol. (a) 157, 499-506 (1996).

(Continued)

*Primary Examiner* — Jonathan Johnson
*Assistant Examiner* — Lynne Edmondson
(74) *Attorney, Agent, or Firm* — Harness, Dickey & Pierce, P.L.C.

(57) ABSTRACT

The present invention relates to a ceramic comprising (or consisting essentially of) a solid solution containing Bi, K, Ti and Fe (and optionally Pb) which exhibits piezoelectric behavior.

11 Claims, 13 Drawing Sheets

(56) References Cited

OTHER PUBLICATIONS

Franco, Jr., A. et al.: "Enhanced magnetic properties of Bi-substituted cobalt ferrites", Journal of Applied Physics 109, 07A745-1 through 3 (2011).

Furuhashi, Takashi et al.: "Synthesis and properties of perovskite $BiFeO_3$—$K_{0.5}Na_{0.5}NbO_3$ ceramics by solid-state reaction", Journal of the Ceramic Society of Japan 118 [8] 701-705 2010.

Hiruma, Yuji et al.: "Ferroelectric and Piezoelectric Properties of $(Bi_{1/2}K_{1/2})TiO_3$ Ceramics", The Japan Society of Applied Physics, vol. 44, No. 7A, 2005, pp. 5040-5044.

Hu, Wei et al.: "$BiFeO_3$—$PbZrO_3$—$PbTiO_3$ ternary system for high Curie temperature piezoceramics", Journal of the European Ceramic Society 31 (2011) 801-807.

Kim, Won-Sik et al.: "Enhanced magnetization in Co and Ta-substituted $BiFeO_3$ ceramics", Journal of Magnetism and Magnetic Materials 321 (2009) 3262-3265.

Leist, Thorsten et al: "Temperature Dependence of the Piezoelectric Coefficient in $BiMeO_3$—$PbTiO_3$ (Me=Fe, Sc, $(Mg_{1/2}Ti_{1/2})$) Ceramics", Journal of The American Ceramic Society, 95 [2] 711-715 (2012).

Leontsev, Serhiy et al.: "Progress in engineering high strain lead-free piezoelectric ceramics", Institute of Physics Publishing, Science and Technology of Advanced Materials 11 (2010) 044302 (13 pp).

Li, Yongtao et al.: "Local structure and magnetic properties study of $Bi(Fe_{0.95}Co_{0.05})O_3$ ceramics", IEEE, 978-1-4244-6644 (2010), 2 pages.

Li, Z. F. et al.: "Dielectric relaxor properties of $K_{0.5}Bi_{0.5}TiO_3$ ferroelectrics prepared by sol-gel method", Journal of Applied Physics, vol. 94, No. 4, Aug. 15, 2003, pp. 2548-2552.

Matsuo, Hiroki et al.: "Structural and piezoelectric properties of high-density $(Bi0.5K0.5)TiO3$—$BiFeO3$ ceramics", American Institute of Physics, Journal of Applied Physics, 108, 104103-1 through 6 (2010).

Morozov, Maxim I. et al.: "Polarization and strain response in $Bi0.5K0.5TiO3$—$BiFeO3$ ceramics", American Institute of Physics, Applied Physics Letters, 101, 252904-1 through 4 (2012).

Morozov, M. I. et al.: "Lead-Free Relaxor-Like $0.75Bi_{0.5}K_{0.5}TiO_3$—$0.25BiFeO_3$ Ceramics with Large Electric Field-Induced Strain", Taylor & Francis Group, LLC, Ferroelectrics, 439:88-94, 2012.

Nakashima, Yoshifumi et al.: "Fabrication and Properties of $BiFeO_3$—$KNbO_3$ Ceramics", Taylor & Francis Group, LLC, Ferroelectrics, 356:180-1894, 2007.

Otonicar, M. et al: "Compositional range and electrical properties of the morphotropic phase boundary in the $Na_{0.5}Bi_{0.5}TiO_3$—$K_{0.5}Bi_{0.5}TiO_3$ system", Journal of the European Ceramic Society 30 (2010) 971-979.

Ozaki, Tomoatsu et al.: "Microstructures Related to Ferroelectric Properties in $(Bi_{0.5}K_{0.5})TiO_3$—$BiFeO_3$", Japanese Journal of Applied Physics 49 (2010) 09MC05-1 through 3.

Ramana, E. Venkata et al.: "Synthesis and magnetoelectric studies on $Na_{0.5}Bi_{0.5}TiO_3$—$BiFeO_3$ solid solution ceramics", Solid State Sciences 12 (2010) 956-962.

Rao, P, Vijaya Bhaskar et al.: "Electrical properties of $K_{0.5}Bi_{0.5}TiO_3$", Journal of Alloys and Compounds 467 (2009) 293-298.

Rao, P. Vijaya Bhaskar et al.: "Impedance spectroscopy studies of $K_{0.5}Bi_{0.5}TiO_3$", J Electroceram (2010) 25:60-69.

Said, Senda et al.: "Relaxor behavior of low lead and lead free ferroelectric ceramics of the $Na_{0.5}Bi_{0.5}TiO_3$—$PbTiO_3$ and $Na_{0.5}Bi_{0.5}TiO_3$—$K_{0.5}Bi_{0.5}TiO_3$ systems", Journal of the European Ceramic Society 21 (2001) 1333-1336.

Sasaki, Atsushi et al.: "Dielectric and Piezoelectric Properties of $(Bi_{0.5}Na_{0.5})TiO_3$- $(Bi_{0.5}K_{0.5})TiO_3$ Systems", Japanese Journal of Applied Physics vol. 38 (1999) pp. 5564-5567, Part I, No. 9B, Sep. 1999.

Scott, James F.: "Iso-Structural Phase Transitions in $BiFeO_3$", Advanced Materials 2010, 22, 2106-2107.

Sebastian, Tutu et al.: "Piezoelectric activity of $(1-x)[0.35Bi(Mg_{1/2}Ti_{1/2})O_3$—$0.3BiFeO_3$—$0.35BiScO3]$—$xPbTiO_3$ ceramics as a function of temperature", J Electroceram (2012) 28:95-100.

Suchanicz, J. et al.: "Axial Pressure Effect on Dielectric and Ferroelectric Properties of $K_{0.5}Bi_{0.5}TiO_3$ Ceramic", Taylor & Francis Group, LLC, Ferroelectrics, 290: 169-175, 2003.

Wada, Takahiro et al.: "Preparation of $(K_{0.5}Bi_{0.5})TiO_3$ Ceramics by Polymerized Complex Method and their Properties", Japanese Journal of Applied Physics vol. 41 (2002) pp. 7025-7028, Part I, No. 11B, Nov. 2002.

Wang, Lei et al.: "Morphotropic phase boundary in $(1-x)Bi_{0.5}Na_{0.5}TiO_3$-$x(Bi_{0.8}La_{0.2})FeO_3$ with improved depolarization temperature", Phys. Status Solidi RRL 3, No. 7-8, 245-247 (2009).

Yao, Zhonghua et al.: "Structure and ferroelectric properties in $(K_{0.5}Bi_{0.5})TiO_3$—$BiScO_3$—$PbTiO_3$ piezoelectric ceramic system", Materials Research Bulletin 44 (2009) 1511-1514.

Yoshii, Kazushige et al.: "Electrical Properties and Depolarization Temperature of $(Bi_{1/2}Na_{1/2})TiO_3$—$(Bi_{1/2}K_{1/2})TiO_3$ Lead-free Piezoelectric Ceramics", The Japan Society of Applied Physics, vol. 45, No. 5B, 2006, pp. 4493-4496.

Zhang, Shan-Tao et al.: "Giant strain in lead-free piezoceramics $Bi_{0.5}Na_{0.5}TiO_3$—$BaTiO_3$—$_{0.5}Na_{0.5}NbO_3$ system", Applied Physics Letters 91, 112906-1 through 3 (2007).

Zhang, Ya-Ru et al.: "Enhancing Electrical Properties in NBT-KBT Lead-Free Piezoelectric Ceramics by Optimizing Sintering Temperature", Journal of the American Ceramic Society, 91 [8] 2716-2719 (2008).

Zhao, Suchuan et al.: "Ferroelectric and piezoelectric properties of $(Na, K)_{0.5}Bi_{0.5}TiO_3$ lead free ceramics", Institute of Physics Publishing, Journal of Physics D: Applied Physics 39 (2006) 2277-2281.

Zhou, Changrong et al.: "Structure and piezoelectric properties of $Bi_{0.5}Na_{0.5}TiO_3$—$Bi_{0.5}K_{0.5}TiO_3$—$BiFeO_3$ lead-free piezoelectric ceramics", Materials Chemistry and Physics 114 (2009) 832-836.

Zhu, Mankang et al.: "Lead-free $(K_{0.5}Bi_{0.5})TiO_3$ powders and ceramics prepared by a sol-gel method", Materials Chemistry and Physics 99 (2006) 829-332.

International Preliminary Report on Patentability issued Jan. 29, 2013 regarding priority Application No. PCT/GB2011/051356, 8 pages.

* cited by examiner

CERAMIC

CROSS-REFERENCE TO RELATED APPLICATIONS

This application is a 371 U.S. National Stage of International Application No. PCT/GB2011/051356, filed on Jul. 19, 2011, and claims priority to British Patent Application No. 1012637.3, filed on Jul. 28, 2010 and British Patent Application No. 1100696.2, filed on Jan. 17, 2011, the disclosures of which are herein incorporated by reference in their entirety.

The present invention relates to a ceramic comprising (or consisting essentially of) a solid solution containing Bi, K, Ti and Fe (and optionally Pb) which exhibits piezoelectric behaviour.

Piezoelectric materials generate an electric field in response to applied mechanical strain. The effect is attributable to a change of polarization density within the material. The piezoelectric effect is reversible in the sense that stress or strain is induced when an electric field is applied to the material. These properties are deployed in piezoelectric sensors and actuators which are used widely in a number of specific applications and instruments. Examples of the use of piezoelectric materials include medical ultrasound and sonar, acoustics, vibration control, spark igniters and (more recently) diesel fuel injection.

The family of ceramics with a perovskite or tungsten-bronze structure exhibits piezoelectric behaviour. There are a number of examples of ceramics with a perovskite structure which are lead-containing. For example, lead zirconate titanate ($Pb[Zr_xTi_{1-x}]O_3$ $0<x<1$) which is more commonly known as PZT exhibits a marked piezoelectric effect and is the most common piezoelectric ceramic in use today. However it has a maximum operating temperature of only about 200° C. WO-A-2006/032872 discloses the lead-containing perovskite compound $(BiFeO_3)_x$—$(PbTiO_3)_{1-x}$ which exhibits piezoelectric behaviour.

There is growing concern over the toxicity of lead-containing devices and this concern is reflected in environmental regulation and policy. As a result there is increasing interest in lead-free piezoelectric materials. Known lead-free piezoelectric materials are $NaNbO_3$, $BiFeO_3$, $(Bi_{1/2}Na_{1/2})TiO_3$, $(Bi_{1/2}K_{1/2})TiO_3$, $BaTiO_3$, $KNbO_3$ and solid solutions such as $(Bi_{1/2}Na_{1/2})TiO_3$—$(Bi_{1/2}K_{1/2})TiO_3$—$BaTiO_3$, $(Bi_{1/2}Na_{1/2})TiO_3$—$(Bi_{1/12}K_{1/2})TiO_3$—$BiFeO_3$ (see Zhou et al, Mat. Chem. & Phys., 114, 2009, 832-836), $(Bi_{1/2}Na_{1/2})TiO_3$—$(Bi_{1/2}K_{1/2})TiO_3$, $(Bi_{1n}K_{1/2})TiO_3$—$BaTiO_3$, $(Bi_{1/2}Na_{1/2})TiO_3$—$BaTiO_3$, $(Bi_{1/2}Na_{1/2})TiO_3$—$BaTiO_3$—$BiFeO_3$ (see Nagata et al, Ferroelectrics, 229, Issue I May 1999, 273-278) and $(K, Na)NbO_3$.

JP-2008-069051 discloses a piezoelectric ceramic containing $x(Bi_aK_{1-a})TiO_3$-$(1-x)BiFeO_3$ and substantial proportions of non-perovskite ternary oxides such as $Bi_2Fe_4O_9$ and $Bi_3Ti_4O_{12}$. The highest Curie point was reported to be 480° C. for the ceramic in which x is 0.3.

The present invention is based on the recognition that solid solutions of formula $x(Bi_aK_{1-a})TiO_3$-$yBiFeO_3$-$zPbTiO_3$ (such as $x(Bi_aK_{1-a})TiO_3$-$(1-x)BiFeO_3$ (hereinafter xKBT-1-xBF)) which are substantially free of non-perovskite phases typically exhibit a high Curie point and/or excellent piezoelectric activity.

Thus viewed from a first aspect the present invention provides a ceramic comprising (eg consisting essentially of or consisting of) a solid solution of formula:

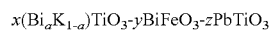

wherein $0.4 \leq a \leq 0.6$;
$0<x<1$;
$0<y<1$;
$0 \leq z \leq 0.5$; and
$x+y+z=1$,
wherein the ceramic is substantially free of non-perovskite phases.

Typically the ceramic of the invention advantageously exhibits a Curie point in excess of 350° C. but often 700° C. or more.

Preferably the ceramic consists essentially of the solid solution. For example, the solid solution may be present in the ceramic in an amount of 50 wt % or more (eg in the range 50 to 99 wt %), preferably 75 wt % or more, particularly preferably 90 wt % or more, more preferably 95 wt % or more.

Preferably the ceramic further comprises one or more perovskite phases. Particularly preferably the (or each) perovskite phase is selected from the group consisting of $(Bi_aK_{1-a})TiO_3$, $BiTiO_3$, $KTiO_3$, $BiFeO_3$ and $PbTiO_3$. The (or each) perovskite phase may be present in an amount of 75 wt % or less, preferably 50 wt % or less, particularly preferably 25 wt % or less, more preferably 5 wt % or less. The (or each) perovskite phase may be present in a trace amount.

The non-perovskite phases may be mixed metal phases of two or more (eg three) of Bi, K, Ti, Fe or Pb. Examples include $Bi_2O_3$, $K_2O$, $Bi_2Fe_4O_9$ and $Bi_3Ti_4O_{12}$.

The amount of non-perovskite phases present in the ceramic may be such that the phases are non-discernible in an X-ray diffraction pattern. The amount of non-perovskite phases present in the ceramic may be a trace amount. Preferably the total amount of non-perovskite phases present in the ceramic is less than 10 wt %, particularly preferably less than 8 wt %, more preferably less than 5 wt %, yet more preferably less than 2 wt %, still yet more preferably less than 1 wt %, most preferably less than 0.1 wt %.

The solid solution may be a partial solid solution. Preferably the solid solution is a complete solid solution.

The solid solution may be substantially monophasic.

The solid solution may be biphasic. Preferably the solid solution has two of the group consisting of a rhombohedral phase, a monoclinic phase, an orthorhombic phase and a tetragonal phase. The solid solution may have a rhombohedral phase and a monoclinic phase. The solid solution may have a rhombohedral phase and orthorhombic phase. Preferably the solid solution has a tetragonal phase and a rhombohedral phase.

Preferably $0 \leq z \leq 0.3$.

In a preferred embodiment, z is 0. Preferably in this embodiment the ceramic comprises (eg consists essentially of or consists of) a solid solution of formula:

wherein a is in the range 0.4 to 0.6 and x is in the range 0.01 to 0.99, wherein the ceramic is substantially free of non-perovskite phases.

The solid solution may be a solid solution of $(Bi_aK_{1-a})TiO_3$ in $BiFeO_3$. The solid solution may be a solid solution of $BiFeO_3$ in $(Bi_aK_{1-a})TiO_3$.

Preferably x is in the range 0.1 to 0.9

Particularly preferably x is in the range 0.7 to 0.9. Particularly preferred in this range is a biphasic solid solution of a tetragonal and rhombohedral phase.

Particularly preferably x is in the range 0.1 to 0.4. The ceramics in this range exhibit a surprisingly high Curie point and are potentially useful in high temperature environments.

Particularly preferably x is in the range 0.5 to 0.6.

Preferably a is in the range 0.45 to 0.55. Particularly preferably a is in the range 0.48 to 0.52. More preferably a is 0.50.

In the solid solution, one or more of Bi, K, Fe and Ti may be substituted by a metal dopant. The metal dopant for each substitution may be the same or different. The presence of a metal dopant may significantly and unpredictably impact on the properties of the solid solution. For example, there may be an improvement in the Curie point and/or the piezoelectric activity.

The (or each) metal dopant may be present in an amount up to 50 at %, preferably up to 20 at %, particularly preferably up to 10 at %, more particularly preferably up to 5 at %, yet more preferably up to 3 at %, most preferably up to 1 at %.

The metal dopant may be an A-site metal dopant. For example, the A-site metal dopant may substitute Bi and/or K. Preferably the A-site metal dopant is selected from the group consisting of Li, Na, Ca, Sr, Ba and a rare earth metal.

The metal dopant may be a B-site metal dopant. For example, the B-site metal dopant may substitute Fe and/or Ti.

A preferred A-site metal dopant is Li or Na. The substitution of Li or Na on the A-site may modify (eg increase) the Curie point and/or favourably shift the phase composition of any biphasic solid solution (eg rhombohedral-tetragonal solid solution).

A preferred A-site metal dopant is Ca, Sr or Ba. The substitution of Ca, Sr or Ba on the A-site may reduce dielectric loss, modify (eg increase) the Curie point and/or favourably shift the phase composition of any biphasic solid solution (eg rhombohedral-tetragonal solid solution).

A preferred A-site metal dopant is a rare earth metal. A particularly preferred A-site metal dopant is La or Nd. Typically La or Nd substitute K. Substitution by La or Nd may increase the piezoelectric activity at the expense of the Curie point. By way of example (for a given $BiFeO_3$ concentration), substitution by La and Nd would typically reduce the Curie point by about 100-200° C. and increase the piezoelectric activity by 50%.

In a particularly preferred embodiment, the A-site metal dopant is La (eg $La^{3+}$) which substitutes K (ie $K^+$). This substitution may improve significantly the resistivity.

A preferred B-site metal dopant has a higher valency than the valency of the metal which it substitutes. Conductivity in perovskites is usually attributable to electron holes or oxygen vacancies. Substituting a higher valence metal dopant onto a B-site may enhance appreciably the resistivity (ie suppress the conductivity).

In a particularly preferred embodiment, the B-site metal dopant has a valency in the range IV to VII. More particularly preferred is a B-site metal dopant selected from the group consisting of Ti, Zr, W, Nb, V, Ta, Mo and Mn. Yet more particularly preferred is a B-site metal dopant selected from the group consisting of Nb, Ta, Mo, W, Zr and V.

A preferred B-site metal dopant is selected from the group consisting of Ti, Fe, Co and Ni. Particularly preferred is Ti (eg $Ti^{4+}$) which substitutes Fe (ie $Fe^{3+}$).

In a preferred embodiment, the B-site metal dopant has a mixed valency. Substituting a mixed valency metal dopant onto a B-site may improve the resistivity significantly.

In a particularly preferred embodiment, the B-site metal dopant is Mn. An advantage of Mn is that it behaves as a buffer in the sense that it can adopt a range of oxidation states which can improve resistivity in a range of ceramics.

In a particularly preferred embodiment, the B-site metal dopant is Co. Typically Co substitutes Fe (ie $Fe^{3+}$).

The ceramic may take the form of a textured ceramic, a single crystal, a thin film or a composite (eg a ceramic/glass or ceramic/polymer composite).

Preferably the Curie point of the ceramic is 350° C. or more, particularly preferably 400° C. or more, more preferably 700° C. or more.

Preferably the ceramic has an X-ray diffraction pattern substantially as illustrated in FIG. 2 or 7.

The ceramic may be obtainable by sintering a sinterable form of a mixed metal oxide containing Bi, K, Fe and Ti (and optionally Pb) to produce the ceramic.

Preferably the ceramic further comprises a pre-sintering additive.

The pre-sintering additive may be present in an amount of 75 wt % or less, preferably 50 wt % or less, particularly preferably 25 wt % or less, more preferably 5 wt % or less. The pre-sintering additive may be present in a trace amount.

The pre-sintering additive may be a perovskite. The pre-sintering additive may be a layered perovskite such as $Bi_4Ti_3O_{12}$. The pre-sintering additive may be a lead-containing perovskite. The lead-containing perovskite may be $PbTiO_3$ or $PbZrO_3$.

The pre-sintering additive may be added post-reaction (eg post-calcination) to form the mixed metal oxide containing Bi, K, Fe and Ti (and optionally Pb). The pre-sintering additive may serve as a sintering aid.

In a preferred embodiment, the ceramic is obtainable by a process comprising:

(A) preparing an intimate mixture of a substantially stoichiometric amount of a compound of each of Bi, K, Ti and Fe (and optionally Pb);

(B) converting the intimate mixture into an intimate powder;

(C) inducing a reaction in the intimate powder to produce a mixed metal oxide;

(D) manipulating the mixed metal oxide into a sinterable form; and (E) sintering the sinterable form of the mixed metal oxide to produce the ceramic.

Viewed from a yet further aspect the present invention provides a process for preparing a ceramic as hereinbefore defined comprising:

(A) preparing an intimate mixture of a substantially stoichiometric amount of a compound of each of Bi, K, Ti and Fe (and optionally Pb);

(B) converting the intimate mixture into an intimate powder;

(C) inducing a reaction in the intimate powder to produce a mixed metal oxide;

(D) manipulating the mixed metal oxide into a sinterable form; and (E) sintering the sinterable form of the mixed metal oxide to produce the ceramic.

In step (A), it may be advantageous for one or more of the compounds of Fe, Ti, K and Bi (and optionally Pb) to depart from a stoichiometric amount. For example, one or more of Fe, Ti, K and Bi (and optionally Pb) is present in excess of the stoichiometric amount. For example, the atomic % may depart from stoichiometry by ±20% or less, preferably ±10% or less, particularly preferably ±5% or less. By departing from stoichiometry, the ceramic may be equipped advantageously with useful oxide phases (eg perovskite phases).

Preferably in step (A) the substantially stoichiometric amount of the compound of each of Bi, K, Ti and Fe (and optionally Pb) is expressed by the compositional formula:

$x(Bi_bK_c)TiO_3-y(BiFe_{1-d}B_dO_3)-zPbTiO_3$ wherein:
B is a B-site metal dopant as defined hereinbefore;
b is in the range 0.4 to 0.6;
c is in the range 0.4 to 0.6;
d is in the range 0 to 0.5; and
x, y and z are as hereinbefore defined.
In a particularly preferred embodiment, B is Ti.
In a particularly preferred embodiment, B is Co.
In a particularly preferred embodiment, d is in the range 0 to 0.2. More preferably d is zero.
In a particularly preferred embodiment, z is zero.
In a particularly preferred embodiment, b is a as hereinbefore defined and c is (1-a).

Step (A) may include a metal dopant oxide which delivers a metal dopant as hereinbefore defined.

The compound of each of Bi, K, Ti and Fe (and optionally Pb) may be independently selected from the group consisting of an oxide, nitrate, hydroxide, hydrogen carbonate, isopropoxide, polymer and carbonate, preferably an oxide and carbonate. Examples are $Bi_2O_3$ and $K_2CO_3$.

The intimate mixture may be a slurry (eg a milled slurry), a solution (eg an aqueous solution), a suspension, a dispersion, a sol-gel or a molten flux.

Step (C) may include heating (eg calcining). Preferably step (C) includes stepwise or interval heating. Step (C) may include stepwise or interval cooling.

Where the intimate mixture is a solution, the compound may be a salt (eg a nitrate).

Where the intimate mixture is a sol-gel, the compound may be an isopropoxide.

Where the intimate mixture is a molten flux, the compound may be an oxide dissolved in a salt flux. The mixed metal oxide from step (C) may be precipitated out on cooling.

Preferably the intimate powder is a milled powder. Step (A) may be:
(A1) preparing a slurry of a substantially stoichiometric amount of a compound of each of Bi, K, Ti and K (and optionally Pb);
(A2) milling the slurry;
and step (B) may be
(B1) drying the slurry to produce the milled powder.

Step (E) may be stepwise or interval sintering. Preferably step (E) includes stepwise or interval heating and stepwise or interval cooling.

Step (E) may be carried out in the presence of a sintering aid. The presence of a sintering aid promotes densification. The sintering aid may be $CuO_2$.

Step (D) may include milling the mixed metal oxide. Step (D) may include pelletising the mixed metal oxide.

Viewed from a still yet further aspect the present invention provides the use of a ceramic as hereinbefore defined in a piezoelectric device.

Preferably in the use according to the invention the piezoelectric device is operable at a temperature in excess of 400° C.

The piezoelectric device may be a piezoelectric actuator, sensor or transformer. For example the piezoelectric device may be an industrial steam sensor.

Preferably in the use according to the invention the piezoelectric device is deployed in an aero-engine.

The present invention will now be described in a non-limitative sense with reference to Examples and accompanying Figures in which:

FIG. 1: A plot of theoretical density vs measured density of solid solutions xKBT-1-xBF where x=0.1 to 0.9;

FIG. 2: X-ray diffraction patterns of solid solutions xKBT-1-xBF where x=0.1 to 0.6;

FIG. 3: Permittivity vs temperature plots for solid solutions xKBT-1-xBF where x=0.4, 0.5 and 0.6;

FIG. 4: Curie point of solid solutions xKBT-1-xBF as a function of composition;

FIG. 5: Strain-field response for various solid solutions xKBT-1-xBF;

FIG. 6: Room temperature dielectric constant of solid solutions xKBT-1-xBF as a function of composition;

FIG. 7: X-ray diffraction patterns for $0.6BiFe_{0.9}Co_{0.1}O_3$-$0.4Bi_{1/2}K_{1/2}TiO_3$ and $0.6BiFe_{0.8}Co_{0.2}O_3$-$0.4Bi_{1/2}K_{1/2}TiO_3$;

FIG. 8: Strain-field plot for $0.6BiFe_{0.8}Co_{0.2}O_3$-$0.4Bi_{1/2}K_{1/2}TiO_3$;

FIG. 9: X-ray diffraction patterns for (a) 0.475BF-0.45 KBT-0.075PT, (b) 0.55 BF-0.3 KBT-0.15 PT and (c) 0.625 BF-0.15 KBT-0.225 PT;

FIG. 10: Polarisation-field loop for 0.55 BF-0.3 KBT-0.15 PT collected at 0.1 Hz and room temperature;

FIG. 11: Bipolar strain-field loop for 0.55 BF-0.3 KBT-0.15 PT collected at 0.1 Hz and room temperature;

FIG. 12: Unipolar strain-field loop for 0.55 BF-0.3 KBT-0.15 PT collected at 0.1 Hz and room temperature; and FIG. 13: Permittivity vs temperature plots for 0.55 BF-0.3 KBT-0.15 PT (labelled 0.15PT) and 0.625 BF-0.15 KBT-0.225 (labelled 0.225PT).

EXAMPLE 1

Experimental Procedure

A sample of the solid solution $x(Bi_aK_{1-a})TiO_3$-(1-x) $BiFeO_3$ was synthesised using a mixed oxide process at each of nine compositions where x=0.1, 0.2, 0.3, 0.4, 0.5, 0.6, 0.7, 0.8 and 0.9 respectively The end point compositions where x=0 and x=1 were prepared for comparative purposes. The formal compositions were:

x=0.1 $0.9BiFeO_3$-$0.1(Bi_{0.5}K_{0.5})TiO_3$
x=0.2 $0.8BiFeO_3$-$0.2(Bi_{0.5}K_{0.5})TiO_3$
x=0.3 $0.7BiFeO_3$-$0.3(Bi_{0.5}K_{0.5})TiO_3$
x=0.4 $0.6BiFeO_3$-$0.4(Bi_{0.5}K_{0.5})TiO_3$
x=0.5 $0.5BiFeO_3$-$0.5(Bi_{0.5}K_{0.5})TiO_3$
x=0.6 $0.4BiFeO_3$-$0.6(Bi_{0.5}K_{0.5})TiO_3$
x=0.7 $0.3BiFeO_3$-$0.7(Bi_{0.5}K_{0.5})TiO_3$
x=0.8 $0.2BiFeO_3$-$0.8(Bi_{0.5}K_{0.5})TiO_3$
x=0.9 $0.1BiFeO_3$-$0.9(Bi_{0.5}K_{0.5})TiO_3$

The precursor powders ($Bi_2O_3$, $Fe_2O_3$, $TiO_2$ and $K_2CO_3$ 99.9% purity, Sigma-Aldrich) were dried at 130° C. for 24 hours in order to remove any moisture and to permit accurate weighing. The powders were weighed in the correct proportions to fabricate the target oxides listed above (see Table 1) and ball milled with yttria stabilised zirconia beads in 2-propanol for 17 hours. The resulting slurry was dried under heat lamps whilst stirring and sieved through 300 micron mesh nylon gauze.

TABLE 1

| Composition (x) | Weight of $Bi_2O_3$ (g) | Weight of $Fe_2O_3$ (g) | Weight of $K_2CO_3$ (g) | Weight of $TiO_2$ (g) | Total Weight (g) | Total Weight - $CO_2$ (g) |
| --- | --- | --- | --- | --- | --- | --- |
| 0 | 148.593 | 51.047 | 0 | 0 | 200 | 200 |
| 0.1 | 145.837 | 47.349 | 2.277 | 5.263 | 200.725 | 200 |
| 0.2 | 142.524 | 43.417 | 4.697 | 10.858 | 201.496 | 200 |
| 0.3 | 138.995 | 39.229 | 7.275 | 16.818 | 202.317 | 200 |
| 0.4 | 135.228 | 34.758 | 10.0273 | 23.179 | 203.193 | 200 |
| 0.5 | 131.199 | 29.976 | 12.971 | 29.985 | 204.130 | 200 |
| 0.6 | 126.878 | 24.847 | 16.128 | 37.282 | 205.136 | 200 |
| 0.7 | 122.235 | 19.334 | 19.522 | 45.126 | 206.217 | 200 |
| 0.8 | 117.228 | 13.392 | 23.180 | 53.581 | 207.381 | 200 |
| 0.9 | 111.816 | 6.967 | 27.135 | 62.723 | 208.641 | 200 |
| 1.0 | 105.946 | 0 | 31.424 | 72.637 | 210.007 | 200 |

The mixture of dried, milled powders was calcined in covered alumina crucibles to induce a chemical reaction to produce the desired perovskite phase. The temperature programme for this step was: heat at 150° C./hour to 800° C., dwell at 800° C. for 4 hours and cool at 300° C./hour to room temperature.

The powder was sieved through a 300 micron mesh and milled as described above. The powder was then made into pellets by loading 0.6 g into a 10 mm die set to be pressed at 50 MPa.

Sintering temperatures of 850° C., 950° C., 975° C., 1000° C., 1040° C. and 1050° C. were tried in order to achieve high density ceramics. Heating was carried out at 50° C./hour to 600° C. and then at 300° C./hour to the desired sintering temperature. Cooling from the sintering temperature was carried out at 150° C./hour to 600 and then at 300° C./hour to room temperature. A lower cooling rate was used in order to minimize thermal shock.

Prior to density, X-ray diffraction, electrical and electromechanical analyses, the sintered pellets were ground flat and parallel to nominally 1 mm thickness.

Results

The optimum sintering temperatures and resultant densities are shown in Table 2.

TABLE 2

| Composition | Optimum sintering temperature/° C. | Density/g cm$^{-3}$ |
| --- | --- | --- |
| x = 0.1 | 975 | 7.5 |
| x = 0.2 | 975 | 7.2 |
| x = 0.3 | 1000 | 7.1 |
| x = 0.4 | 1000 | 6.4 |
| x = 0.5 | 1040 | 6.8 |
| x = 0.6 | 1025 | 6.4 |

The density is also shown in FIG. 1 plotted against the theoretical density calculated from x-ray diffraction analysis.

X-ray diffraction analysis was carried out on the sintered pellets in order to confirm the crystal structure. The outcome of this analysis is shown in FIG. 2. An interpretation of FIG. 2 shows all the compositions to be a single phase of rhombohedral symmetry. There are no secondary, deleterious non-perovskite phases.

The Curie point is the temperature at which a ferroelectric material transforms to paraelectric. In the present xKBT-1-xBF system, this occurs with the transition from a polar rhombohedral structure to a non-polar cubic structure and was measured by plotting the relative permittivity vs temperature (see FIG. 3). A maximum in the relative permittivity vs temperature curve denotes the Curie point. The Curie point of the compositions x=0.1 to 0.4 is such that no peak could be found using this technique (ie the Curie point is >ca. 600° C.).

In order to determine the Curie point of the compositions x=0.3 and 0.4, the crystal structure was studied as a function of temperature. This showed that the composition x=0.3 has a Curie point of 720° C. and the composition x=0.4 has a Curie point of 700° C.

From the known Curie point of $BiFeO_3$, it is assumed that the Curie point for the compositions x=0.1 and 0.2 is between 720 and 820° C. However at these temperatures, $K_2O$ and $Bi_2O_3$ become volatile and the composition modifies. The data is shown in FIG. 4.

The piezoelectric activity of the various compositions is shown in FIG. 5. The composition x=0.6 exhibits the optimum piezoelectric activity.

When driven at the same drive field (7.5 kVmm$^{-1}$), the piezoelectric activity (defined as the maximum strain/maximum electric field) for each composition is shown in Table 3. No strain was generated for the composition x=0.1 at this electric field.

TABLE 3

| Composition | Piezoelectric activity/pm V$^{-1}$ |
| --- | --- |
| x = 0.6 | 330 |
| x = 0.5 | 130 |
| x = 0.4 | 90 |
| x = 0.3 | 45 |
| x = 0.2 | 25 |
| x = 0.1 | — |

FIG. 6 shows the room temperature dielectric constant as a function of composition.

EXAMPLE 2 x=0.6 y=0.05 (1-x)Bi(Fe$_{(1-y)}$Co$_y$)O$_3$-x(Bi$_{0.5}$K$_{0.5}$)TiO$_3$
x=0.6 y=0.1 (1-x)Bi(Fe$_{(1-y)}$Co$_y$)O$_3$-x(Bi$_{0.5}$L$_{0.5}$)TiO$_3$
x=0.6 y=0.2 (1-x)Bi(Fe$_{(1-y)}$Co$_y$)O$_3$-x(Bi$_{0.5}$K$_{0.5}$)TiO$_3$

The precursor powders ($Bi_2O_3$, $Fe_2O_3$, $TiO_2$, $K_2CO_3$ and CoO 99.9% purity, Sigma-Aldrich) were dried at 130° C. for 24 hours in order to remove any moisture and to permit accurate weighing. The powders were weighed in the correct proportions to fabricate the target oxides listed below (see Table 4) and ball milled with yttria stabilised zirconia beads in 2-propanol for 17 hours. The resulting slurry was dried under heat lamps whilst stirring and sieved through 300 micron mesh nylon gauze.

TABLE 4

| Composition (y) | Weight of $Bi_2O_3$ (g) | Weight of $Fe_2O_3$ (g) | Weight of $K_2CO_3$ (g) | Weight of $TiO_2$ (g) | Weight of CoO (g) | Total Weight (g) | Total Weight - $CO_2$ (g) |
|---|---|---|---|---|---|---|---|
| 0.05 (5% Cobalt) | 126.928 | 23.614 | 16.135 | 37.295 | 1.167 | 205.1378 | 200 |
| 0.10 (10% Cobalt) | 126.976 | 22.380 | 16.140 | 37.309 | 2.334 | 205.140 | 200 |
| 0.2 (20% Cobalt) | 127.074 | 19.908 | 16.153 | 37.338 | 4.671 | 205.1437 | 200 |

The mixtures of dried, milled powders were calcined in covered alumina crucibles to induce a chemical reaction to produce the desired perovskite phase. The temperature programme for this step was: heat at 150° C./hour to 800° C. for 4 hours and to cool at 300° C./hour to room temperature.

The powder was again sieved through a 300 μm mesh and milled as described above with 1 wt % Glascol HA40 binder and sieved a final time. The powder was then fabricated into pellets by loading 0.6 g into a 10 mm diameter die and pressed at 30 MPa for 5 minutes. The pellets were then cold isostatic pressed for five minutes at 350 MPa.

Sintering temperatures of 1000° C. and 1025° C. were attempted in order to obtain high density ceramics. The sintering regime was as follows: 50° C./hour to 600° C. and then at 300° C./hour to the sintering temperatures outlined above. Cooling from the sintering temperature was carried out at 150° C./hour to 600° C. and then at 300° C./hour to room temperature. Cooling rates were lower to minimize thermal shock.

Prior to density and X-ray diffraction analysis, the pellets were ground flat and parallel to 1 mm in thickness.

Prior to electrical testing such as strain field loops and permittivity v temperature analysis, the pellets were ground flat and parallel to 0.3 mm.

Results

FIG. 7 shows X-ray diffraction patterns for $0.6BiFe_{0.9}Co_{0.1}O_3-0.4Bi_{1/2}K_{1/2}TiO_3$ and $0.6BiFe_{0.8}Co_{0.2}O_3-0.4Bi_{1/2}K_{1/2}TiO_3$. The patterns are single phase perovskite and showed no secondary non-perovskite phases.

The strain/electric field response for composition x=0.6, y=0.2 is shown in FIG. 8. Using an applied electric field of 4 kV mm$^{-1}$, a strain of 0.44% was generated with a high field $d_{33}$=1100 pm V$^{-1}$ which is far higher than is observed in PZT.

EXAMPLE 3

A sample of the solid solution $x(Bi_aK_{1-a})TiO_3-y(BiFeO_3)-(1-x-y)PbTiO_3$ was synthesised using the mixed oxide process described in the previous Examples at each of the following compositions 0.475BF-0.45 KBT-0.075PT
0.55BF-0.3 KBT-0.15PT
0.625BF-0.15 KBT-0.225PT The powders were weighed in the correct proportions to fabricate these target oxides (see Table 5).

TABLE 5

| Composition | Weight of $Bi_2O_3$ (g) | Weight of $Fe_2O_3$ (g) | Weight of $K_2CO_3$ (g) | Weight of $TiO_2$ (g) | Weight of PbO (g) | Total Weight (g) | Total Weight - $CO_2$ (g) |
|---|---|---|---|---|---|---|---|
| 0.475BF-0.45KBT-0.075PT | 120.680 | 28.064 | 11.505 | 31.027 | 12.387 | 203.663 | 200 |
| 0.55BF-0.3KBT-0.15PT | 115.058 | 30.982 | 7.313 | 25.356 | 23.620 | 202.329 | 200 |
| 0.625 BF-0.15KBT-0.225PT | 109.937 | 33.640 | 3.494 | 20.189 | 33.853 | 201.113 | 200 |

X-ray diffraction data are given in FIG. 9.
Results

Table 6 shows density and sintering temperature for the three compositions.

TABLE 6

| Composition | Sintering Temp (° C.) | Density (kg/m3) | Tc (° C.) |
|---|---|---|---|
| 0.475 BF-0.45 KBT 0.075 PT | 1045 | 7000 | — |
| 0.55 BF-0.3 KBT-0.15 PT | 1035 | 7250 | 525 |
| 0.625 BF-0.15 KBT-0.225 | 1025 | 7300 | 590 |

Figure 1:
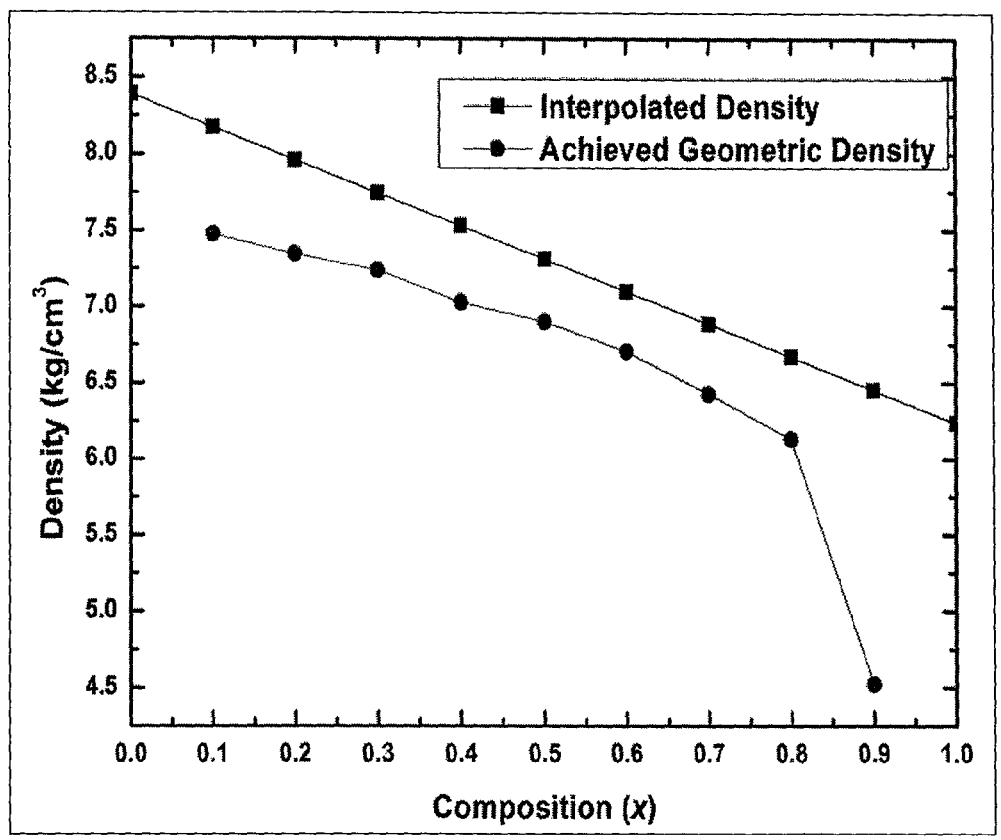
Figure 2:
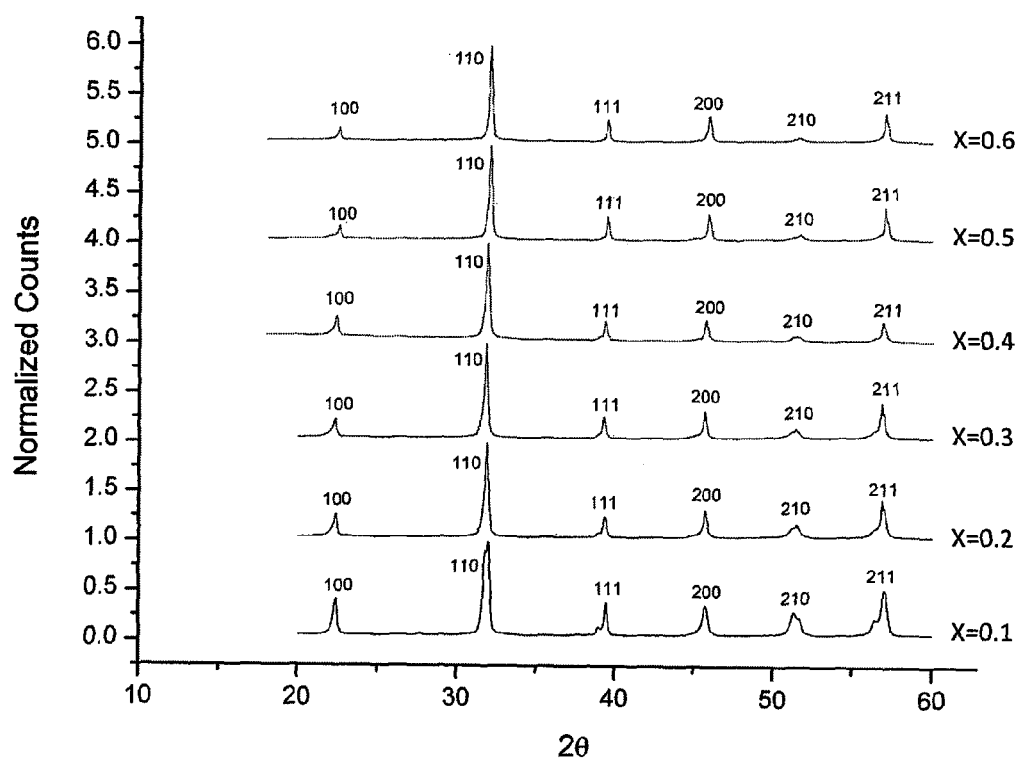
Figure 3:
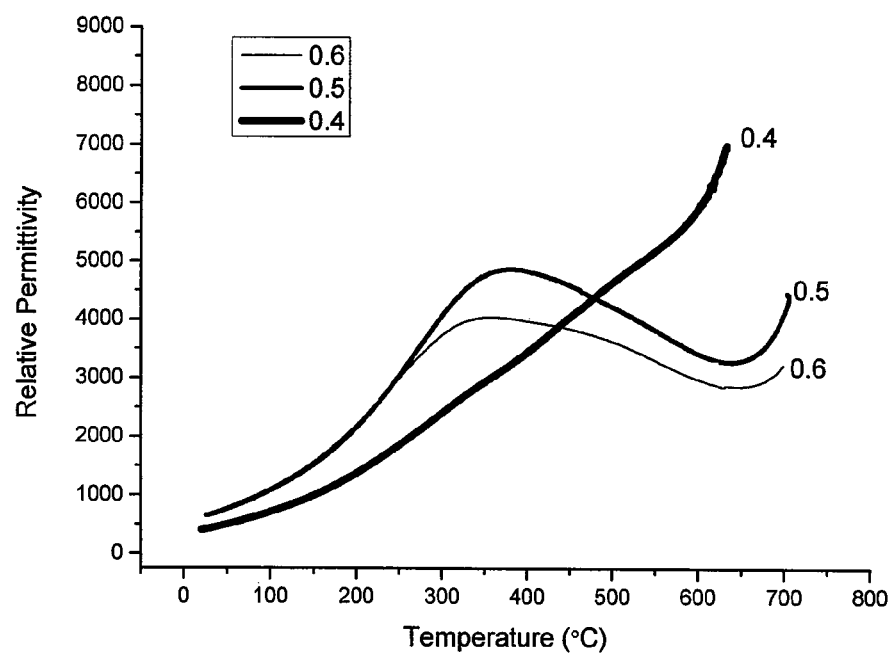
Figure 4:
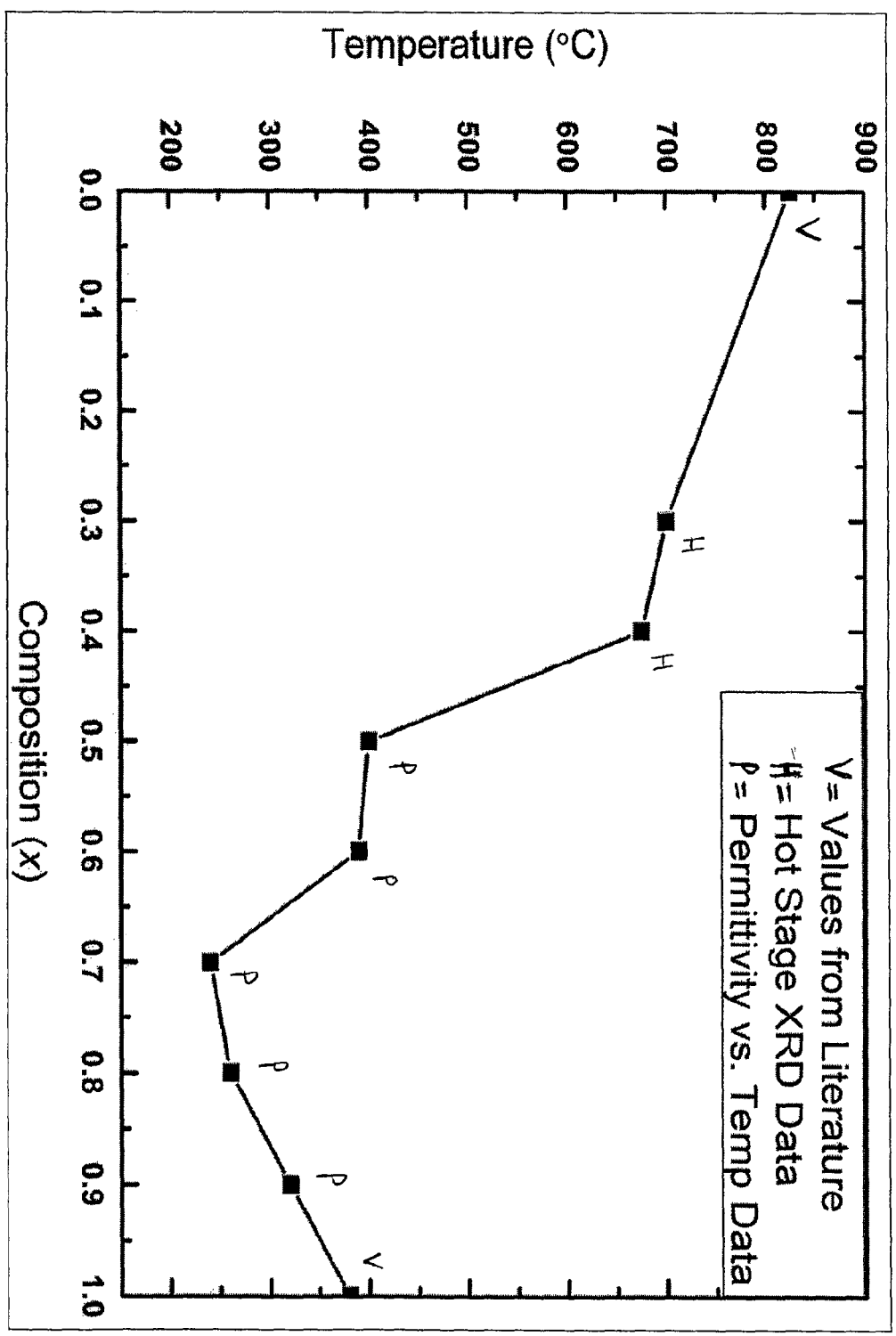
Figure 5:
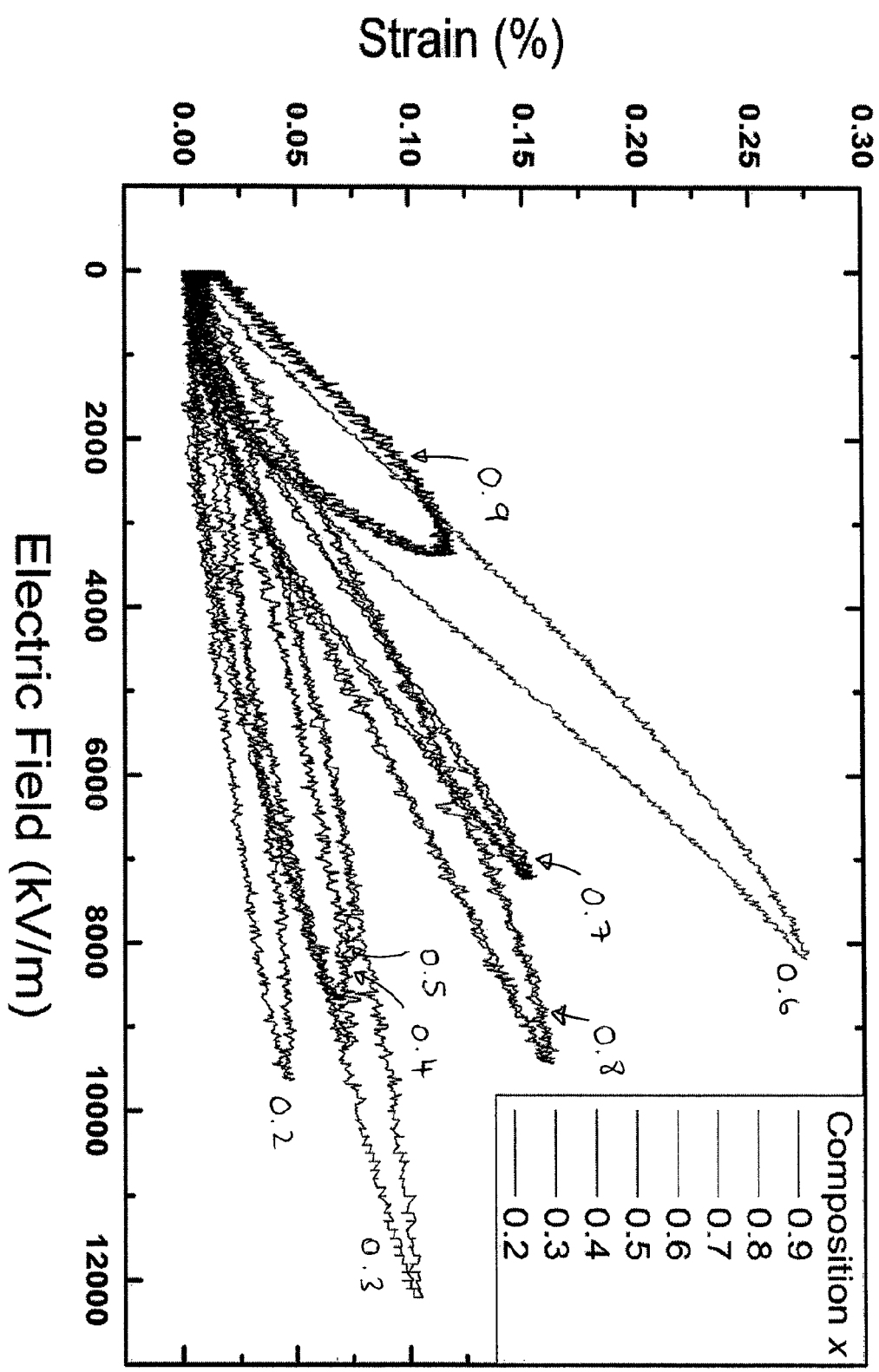
Figure 6:
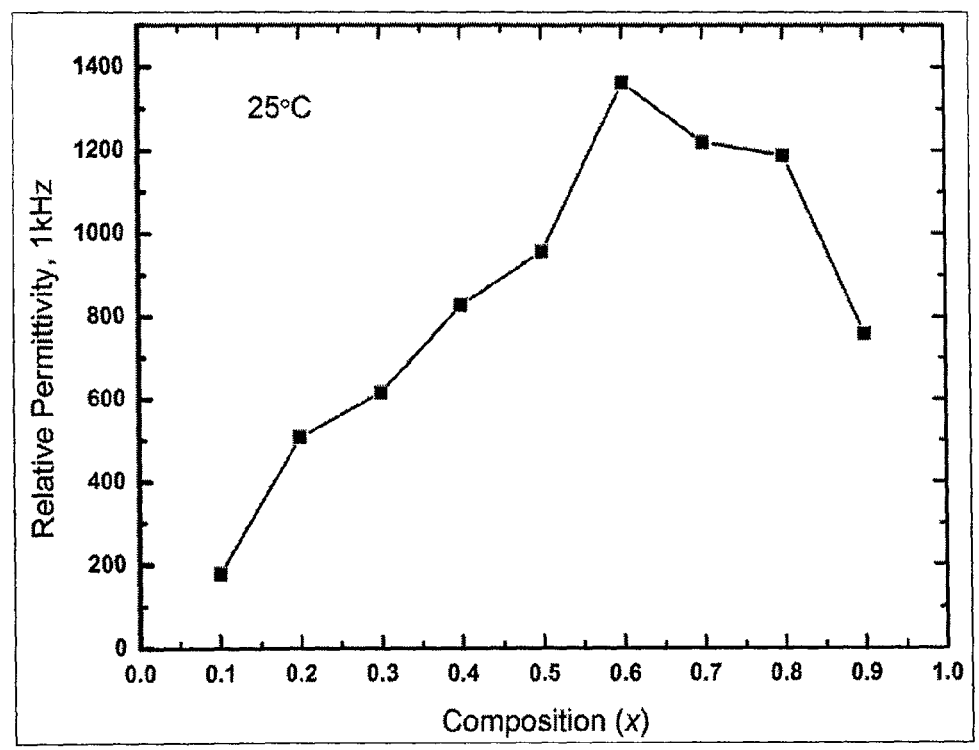
Figure 7:
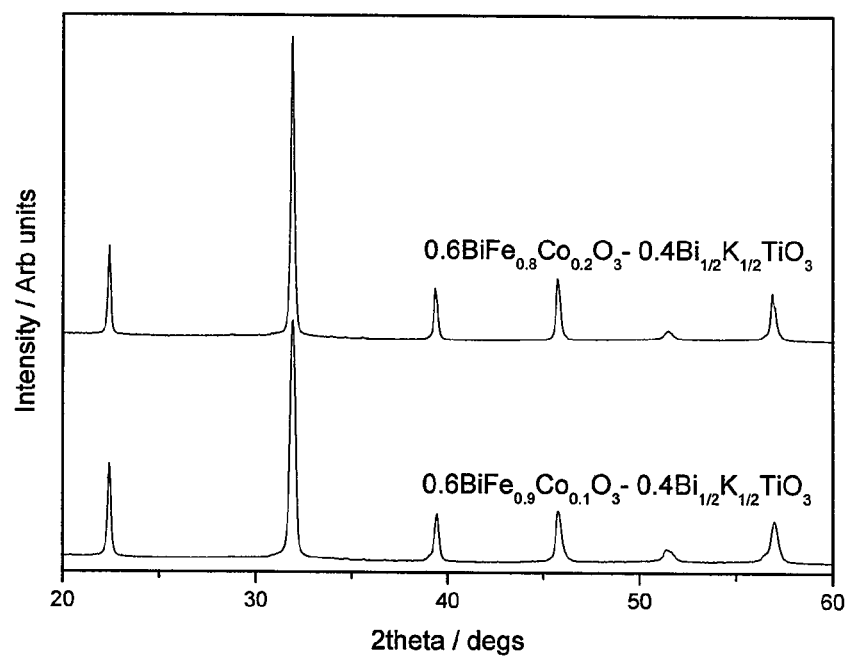
Figure 8:
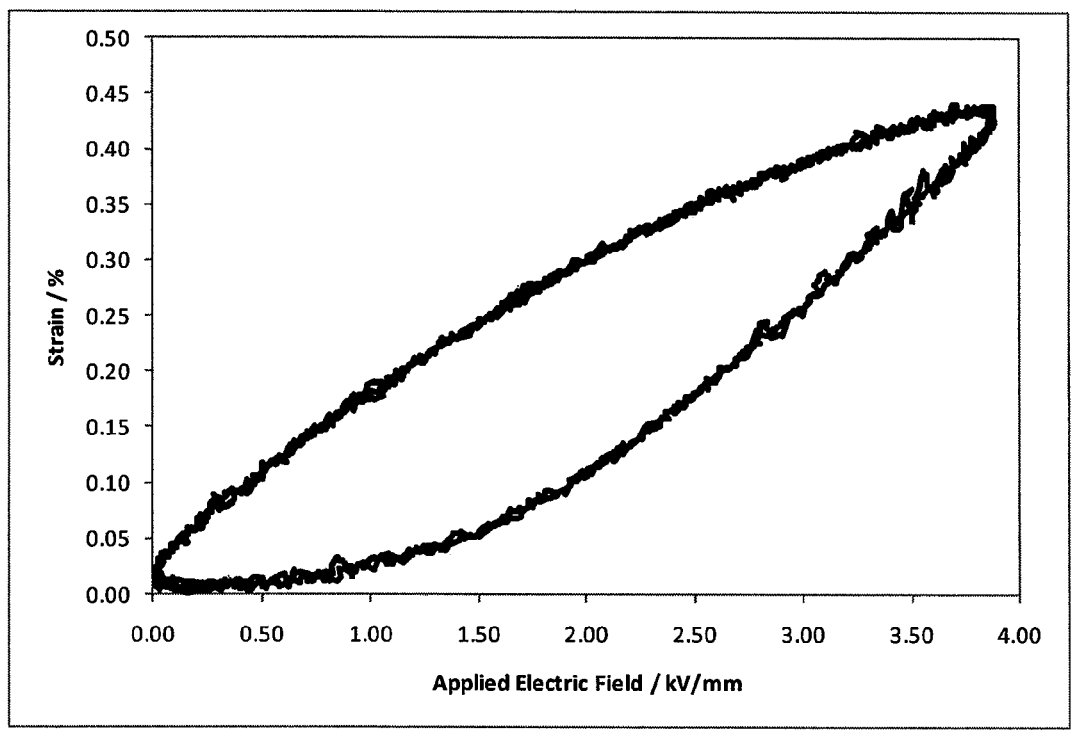
Figure 9:
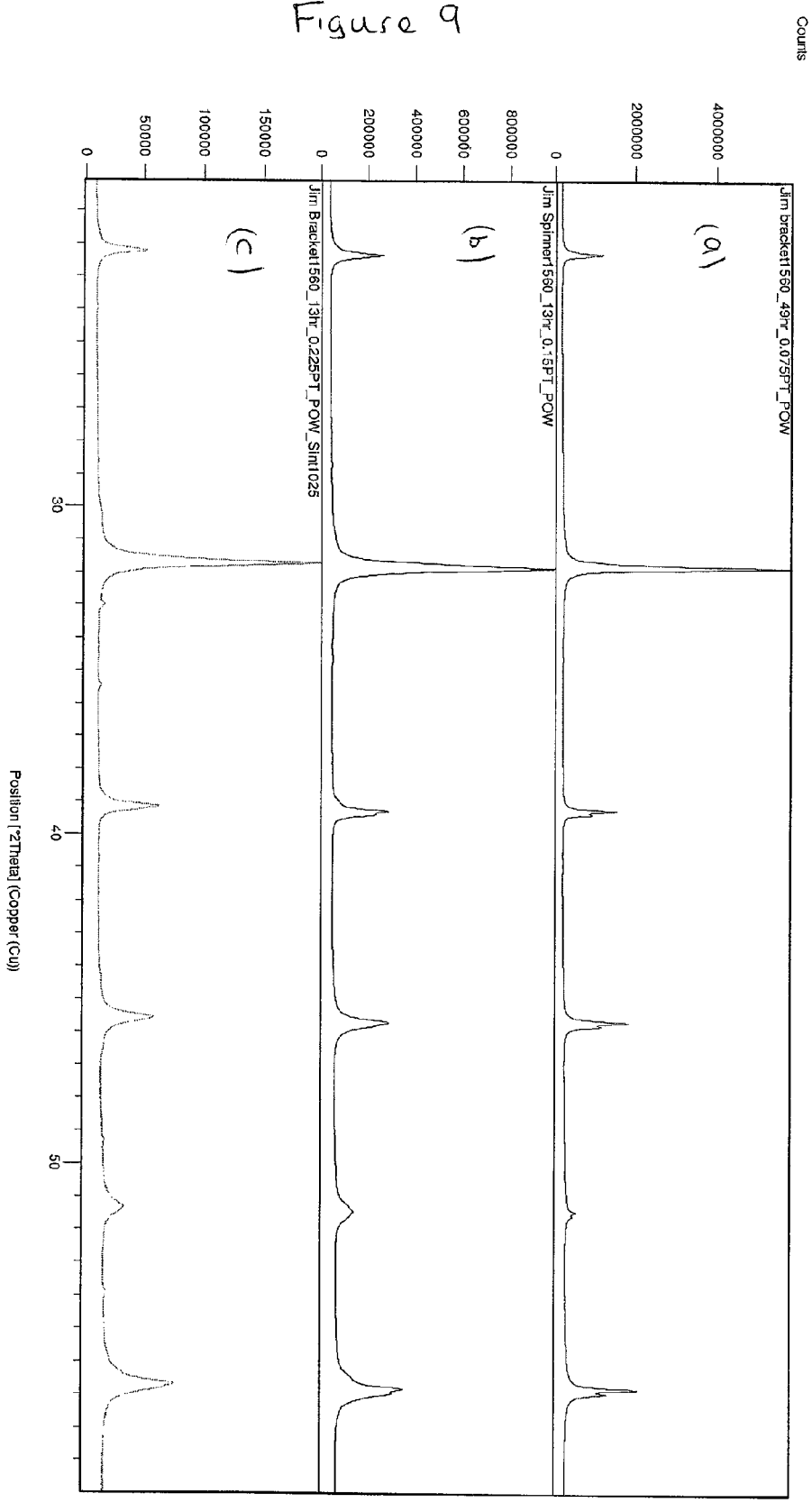
Figure 10:
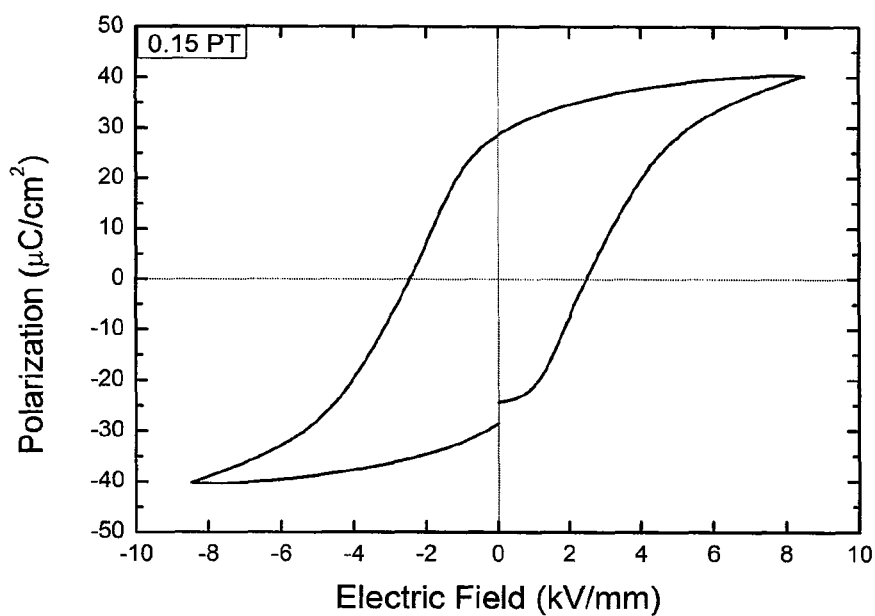
FIG. 10 is a polarisation-field loop for 0.55 BF-0.3 KBT-0.15 PT collected at 0.1 Hz and room temperature. The remnant polarisation and coercive field are similar to that observed in PZT.
Figure 11:
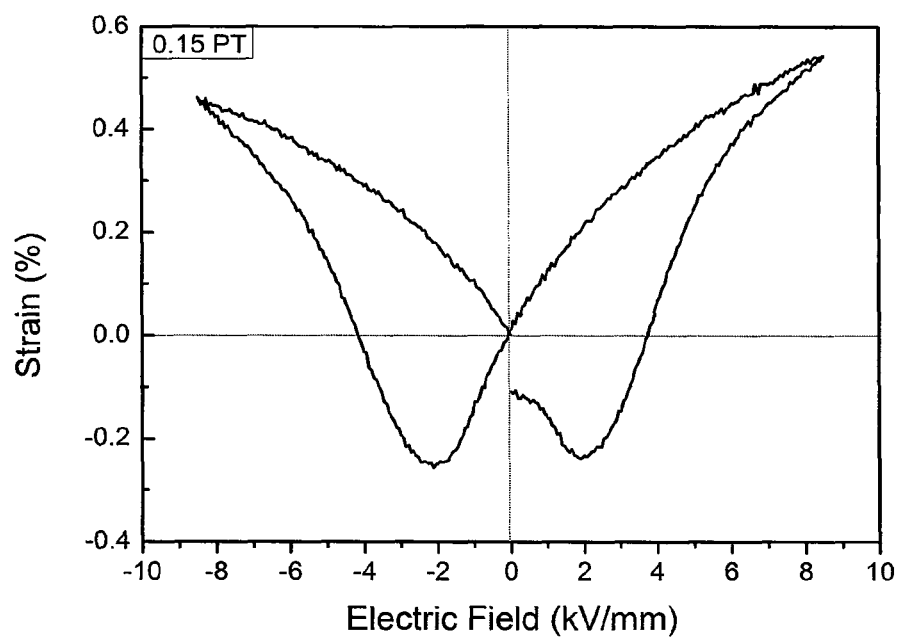
FIG. 11 is a bipolar strain-field loop for 0.55 BF-0.3 KBT-0.15 PT collected at 0.1 Hz and room temperature. The total peak to peak strain is >0.7%.
Figure 12:
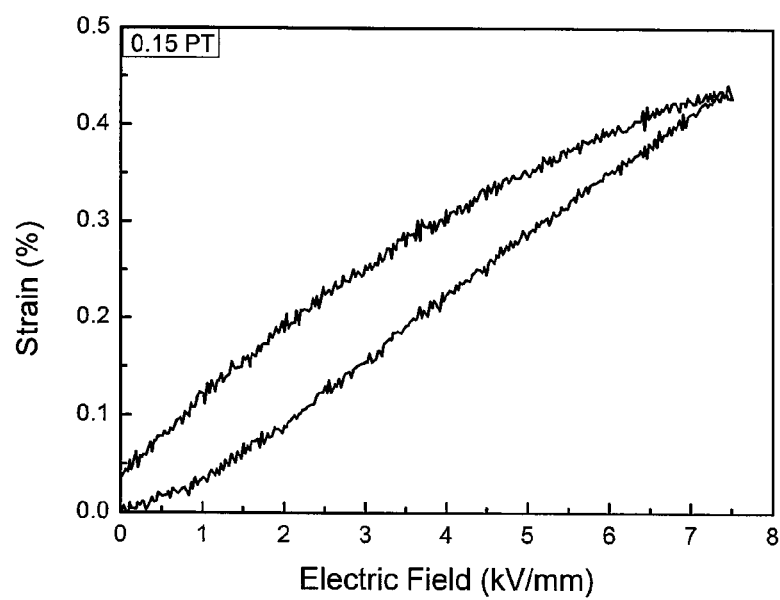

FIG. 12 is a unipolar strain-field loop for 0.55 BF-0.3 KBT-0.15 PT collected at 0.1 Hz and room temperature. The total strain exceeds 0.43% at 7.5 kV/mm. The high field d33 (max strain/max field) is 575 pmV$^{-1}$.

Figure 13:
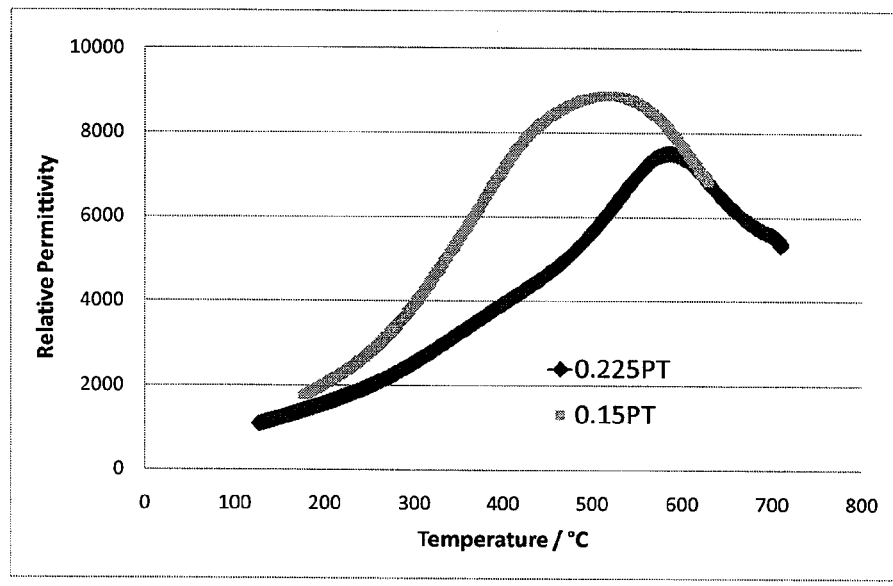

FIG. 13 illustrates permittivity vs temperature plots for 0.55 BF-0.3 KBT-0.15 PT (labelled 0.15PT) and 0.625 BF-0.15 KBT-0.225 (labelled 0.225PT). From the maximum in dielectric constant, the inferred ferroelectric paraelectric transition temperatures are 520° C. and 590° C. respectively. The data was collected on cooling from high temperature at a frequency of 100 kHz.

Summary

The composition 0.55 BF-0.3 KBT-0.15 PT exhibits a high field d33 of 575 pm V$^{-1}$ which is higher than most hard commercial PZT materials and a $T_C$ of 525 (PZT max=350). In addition, the density is lower than that of PZT (typically 7700 to 7900) which may be useful for some applications. The total strain (both bipolar and Unipolar) exceeds that exhibited by conventional PZT based materials.

The invention claimed is:

1. A ceramic comprising a solid solution of formula:

$$x(Bi_aK_{1-a})TiO_3\text{-}yBiFeO_3\text{-}zPbTiO_3$$

wherein $0.4 \leq a \leq 0.6$;
$0 < x < 1$;
$0 < y < 1$;
$0 < z \leq 0.5$; and
$x+y+z=1$,
wherein the ceramic is substantially free of non-perovskite phases.

2. A ceramic as claimed in claim 1 wherein $0 < z \leq 0.3$.

3. A ceramic as claimed in claim 1 further comprising one or more perovskite phases selected from the group consisting of $(Bi_aK_{1-a})TiO_3$, $BiTiO_3$, $KTiO_3$, $BiFeO_3$ and $PbTiO_3$.

4. A ceramic as claimed in claim 1 wherein the solid solution has two of the group consisting of a rhombohedral phase, a monoclinic phase, an orthorhombic phase and a tetragonal phase.

5. A ceramic as claimed in claim 1 wherein x is in the range 0.7 to 0.9.

6. A ceramic as claimed in-claim 1 wherein x is in the range 0.1 to 0.4.

7. A ceramic as claimed in-claim 1 wherein x is in the range 0.5 to 0.6.

8. A ceramic as claimed in claim 1 wherein a is 0.50.

9. A ceramic as claimed in claim 1 obtainable by a process comprising:
  (A) preparing an intimate mixture of a substantially stoichiometric amount of a compound of each of Bi, K, Ti, Fe and Pb;
  (B) converting the intimate mixture into an intimate powder;
  (C) inducing a reaction in the intimate powder to produce a mixed metal oxide;
  (D) manipulating the mixed metal oxide into a sinterable form; and
  (E) sintering the sinterable form of the mixed metal oxide to produce the ceramic.

10. A process for preparing a ceramic as defined in claim 1 comprising:
  (A) preparing an intimate mixture of a substantially stoichiometric amount of a compound of each of Bi, K, Ti, Fe and Pb;
  (B) converting the intimate mixture into an intimate powder;
  (C) inducing a reaction in the intimate powder to produce a mixed metal oxide;
  (D) manipulating the mixed metal oxide into a sinterable form; and
  (E) sintering the sinterable form of the mixed metal oxide to produce the ceramic.

11. A process as claimed in claim 10 wherein in step (A) the substantially stoichiometric amount of the compound of each of Bi, K, Ti, Fe and Pb is expressed by the compositional formula:

$$x(Bi_bK_c)TiO_3\text{-}y(BiFe_{1-d}B_dO_3)\text{-}zPbTiO_3$$

wherein:
  B is a B-site metal dopant selected from the group consisting of Ti, Zr, W, Nb V, Ta, Mo, Mn, Co and Ni;
  b is in the range 0.4 to 0.6;
  c is in the range 0.4 to 0.6;
  d is in the range 0 to 0.5.